United States Patent
Hulfachor et al.

(10) Patent No.: US 7,030,669 B2
(45) Date of Patent: Apr. 18, 2006

(54) CIRCUIT TO LINEARIZE GAIN OF A VOLTAGE CONTROLLED OSCILLATOR OVER WIDE FREQUENCY RANGE

(75) Inventors: Ronald B. Hulfachor, Nashua, NH (US); James J. McDonald, II, Gorham, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 51 days.

(21) Appl. No.: 10/779,891

(22) Filed: Feb. 17, 2004

(65) Prior Publication Data

US 2004/0164815 A1 Aug. 26, 2004

Related U.S. Application Data

(60) Provisional application No. 60/447,569, filed on Feb. 14, 2003.

(51) Int. Cl.
*H03L 7/06* (2006.01)

(52) U.S. Cl. .................. 327/156; 327/157
(58) Field of Classification Search ........ 327/156–159; 331/DIG. 2; 375/376
See application file for complete search history.

(56) References Cited

U.S. PATENT DOCUMENTS

| | | | |
|---|---|---|---|
| 5,686,864 A | | 11/1997 | Martin et al. |
| 5,703,511 A | * | 12/1997 | Okamoto ............... 327/157 |
| 5,748,048 A | | 5/1998 | Moyal |
| 5,786,726 A | | 7/1998 | Lemasson |
| 2001/0038307 A1 | | 11/2001 | Hosoi, et al. |

FOREIGN PATENT DOCUMENTS

EP      1 022 846 A1    7/2000

* cited by examiner

*Primary Examiner*—Kenneth B. Wells
(74) *Attorney, Agent, or Firm*—Edwin H. Paul, Esq.; Cesari and McKenna, LLP

(57) ABSTRACT

A voltage controlled oscillator circuit is shown using multiple delay stages with the last stage looped back out of phase to the first stage. Each stage delay is formed by charging one or more capacitors. The circuitry uses active components demonstrating a square law relationship between a control voltage and a resulting current. The current is ultimately used to charge the delay capacitor. The net effect is a linear relationship of the VCO frequency and an input control voltage. The range of the linear relationship is extended by using square law current sources to provide suitable currents that extend the linear range when other active devices are no longer supporting the square law relationship. In addition bipolar device are used to compensate for temperature and batch to batch processing effects of FET devices.

8 Claims, 3 Drawing Sheets

CIRCUIT TO LINEARIZE GAIN OF A VOLTAGE CONTROLLED OSCILLATOR OVER WIDE FREQUENCY RANGE

CROSS-REFERENCE TO RELATED APPLICATIONS

The present application claims the benefit of U.S. Provisional Patent Application Ser. No. 60/447,569, which was filed on Feb. 14, 2003, of common inventorship. owner-ship and title, and is hereby incorporated by reference.

BACKGROUND OF THE INVENTION

1. Field of the Invention

The present invention relates to voltage controlled oscillators (VCO's), and more particularly to linearizing gain (frequency out/voltage) of VCO's over a wide frequency range.

2. Background Information

VCO's are commonly used in many applications, especially in communication and control applications. Virtually all phase-locked-loop (PLL) circuits employ a VCO in the control loop. FIG. 1 is a block diagram of such a phase-locked-loop circuit. A phase and frequency detector 2 compares an input reference or clock signal 4 to a feedback signal 6 that is a frequency divided VCO output signal 8. The phase-frequency detector 2 provides an UP or DOWN error signal into a charge pump 10 that together with a Loop filter 12 generates a control voltage Vcnt 14. A Loop Buffer 16 and a VCO 18 complete the loop to the VCO output signal 8. The feedback signal 6 is derived from signal 8, typically (but not necessarily) by dividing the signal as shown. As is well known in such systems the feed back loop operates to reduce the differences between the clock signal 4 and the divided signal 6. Not shown, but often found in such circuits, are analog to digital converters that may form parts of the PLL loop. In such cases the operations described in any one block of FIG. 1 are carried out digitally as is well known in the art.

Most VCO's used in a PLL and elsewhere strive to operate over a wide frequency range. One primary aspect determining that frequency range is the linearity of the VCO's gain. Non-linearities tend to increase phase offsets between the input and looped back signal and change the loop gain which may lead to "overshooting" and other stability issues. This in turn leads to compromising the loop filter parameters, which leads to limiting the operating frequency range of the PLL. Other negative effects of non-linearities may include increased noise, increased acquisition times, and/or frequency jitter.

FIG. 2 is a common delay string of five pulse delay elements, t1–t5, that wraps around to create an oscillator circuit. A control signal, Vcnt, is fed to each delay element to change the delay of each element and thus the frequency of the circuit. This type of oscillator is found in the prior art and may be used in a preferred embodiment of the present invention. FIG. 3 diagrams a five stage oscillator where the output of the last delay circuit, t5, loops back to the input of the first delay circuit, t1. A phase reversal is incorporated into the loop to cause oscillations. In such a circuit the delay, T, of each circuit is added to get the period P of the oscillator, and inverting the period yields the frequency. If each circuit delay is equal, the resulting frequency is an inverse function of one circuit delay, or Fosc=K1(1/T). The power on reset, POR, allows the oscillation to start.

FIG. 4 shows the optimal relationship for a VCO where the frequency out is a straight line function of a control voltage in with a slope of K2. The relationship as applied to a VCO with an input control voltage, Vcnt, is:

$$Fosc=K2(Vcnt) \text{ plus some offset} \qquad \text{Eq. 1}$$

The following discussion drops the offset and considers the relationship to pass through the origin for simplicity. However, as will be understood by those skilled in the art, there is no loss in the general applicability of the following discussion.

The effort to linearly extend this line has been an ongoing objective in the art and is an objective of the present invention.

It is well known in the art to use a current source to charge a capacitor to create a delay circuit suitable for use in a delay type oscillator described above. The well known relation ship of a current I charging a capacitor C is:

$$I=C(dv/dt) \qquad \text{Eq. 2.}$$

The delay, T, of one delay circuit, will be a function of the time it takes the voltage on the charging capacitance to reach some circuit determined threshold level, V1. V1 is considered for this discussion to start from a complete discharge or zero volts. Again there will be some small residual voltage, that will not affect the general applicability of the present invention as understood by those skilled in the art. So the dv/dt can be written as V1/T, and Eq. 2 becomes $I=C(V1/T)$. Rearranging yields:

$$1/T=(I/CV1) \qquad \text{Eq. 3, and}$$

$$T=(CV1/I)$$

So, the delay of one circuit is CV1, and the frequency of the delay circuit will be a constant equal to the number of delay circuit stages times 1/T, or $$Fosc=K1(1/T)=K1(I/CV1).$$

As discussed below the current, I, of Eq. 3 is shown to be a function of the square of Vcnt (Vcnt^2) for a specific design, and so, as discussed above, the frequency of the sequential delay circuit oscillator will be:

$$Fosc=(K3/CV1)Vcnt^2 \qquad \text{Eq. 4}$$

As discussed below, V1 is a function of Vcnt, and C is a constant along with K3, resulting in:

$$Fosc=(K3/C)(Vcnt^2/Vcnt) \qquad \text{Eq. 5, or}$$

$$Fosc=K2(Vcnt), \qquad \text{Eq. 6,}$$

which is a relationship oF interest as discussed below.

FIG. 5 is a copy of item 22 from U.S. Pat. No. 5,748,048 to Moyal (Moyal), and assigned to Cypress Semiconductor Corp. Moyal and FIG. 6 completes a partial schematic showing a single delay stage of charging of the capacitor C that illustrates the square law relationship. In FIG. 5, P3 and N2 are operated as FET diode clamps. A FET diode clamp is a FET that operates in the saturation region where the drain current is approximately related to the square of the gate to source voltage. Here the current I1 is proportional to the square of the Vcnt (less threshold voltages). Current I1' mirrors I1, and, following FIG. 6, I1" mirrors I1' (although with current mirrors there may be a factor due to channel size involved). The delay of I1" charging capacitor C is inversely related to I1," as is well known. As applied to the analysis above, from FIG. 5 and Eq. 4, Vcnt will be related to the root of I1 and therefor to maintain the linearity of FIG. 4. The V1 of Eq. 4 will also be related to the square root of I, therefore canceling each other out of Eq. 4 as shown above in Eq. 5.

It is clear that linear frequency range shown in FIG. 4 depends on the square law relationship discussed above. Moreover, to extend the linear relationship of FIG. 4, the square law relationship, Vcnt to I1, of FIG. 5 and Eq. 4, must be correspondingly extended.

In the circuit of FIG. 5, since P3 and N2 are FETS built simultaneously with N1, P1 and the other FETS, process variations from chip to chip or batch to batch will correlate among the FETs. For example the temperature coefficients, TC's (usually positive) will track and at higher temperature larger FET threshold voltages, Vt's, will act to restrict the operating range of the circuit. In this case "threshold" refers to the gate voltage necessary to drive a given drain current, not the threshold that begins to turn on an FET. Moreover, if the fabricating process produces slow FET's, all will be slow and may affect the high frequency range of the VCO. Also, as the Vcnt goes low, the threshold of the FET's become a factor and the square law relationship may not hold. In such a case the linearity of the VCO will deteriorate causing problems discussed above.

The present invention addresses these limitations.

SUMMARY OF THE INVENTION

In view of the foregoing background discussion, the present invention provides a voltage controlled oscillator (VCO) with an extended linear range and improved temperature and processing compensation.

Ideally the input control signal for a VCO changes the frequency of the VCO in a linear manner over as wide a range as possible, and that frequency remains stable for changes in temperature and processing. In the present invention the control voltage is input to the gate of a first FET, preferably an N type MOSFET, that outputs current. The source of the first FET connects to a resistor in parallel with a diode connected bipolar transistor. The use of bipolar devices acts to compensate for temperature and for processing effects, and provide an exponential response as described below. The drain of the first FET is connected to the drain of a second FET, preferably to a diode connected P type MOSFET, that carries the drain current from the first FET. The current through this second FET controls the output signal frequency. However, until the input control signal FET overcomes its threshold voltage, there will be no current through the first FET, and so none through the second FET. In such an instance the VCO would not function. The present invention provides a diode connected third FET, preferably an N type MOSFET, that draws current through the drain of the second FET and therefore current is drawn through the second FET even when there is no current through the first FET. This extends the operating range of the VCO. Moreover, the current drawn by the third FET follows the same relationship as the current that would have been provided by the first FET if the threshold voltage were not present. This has the beneficial result of extending the linear range of the VCO.

In preferred embodiment, a diode connected bipolar PNP is placed parallel to the bipolar diode connected NPN. A fourth diode connected FET is placed in series with the third diode connected FET, and another P type FET is connected to mirror the current through the first P type FET. The current through the first P type FET and the mirror current, in a preferred embodiment are used in tandem to control the delay feedback of a preferred VCO circuit.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
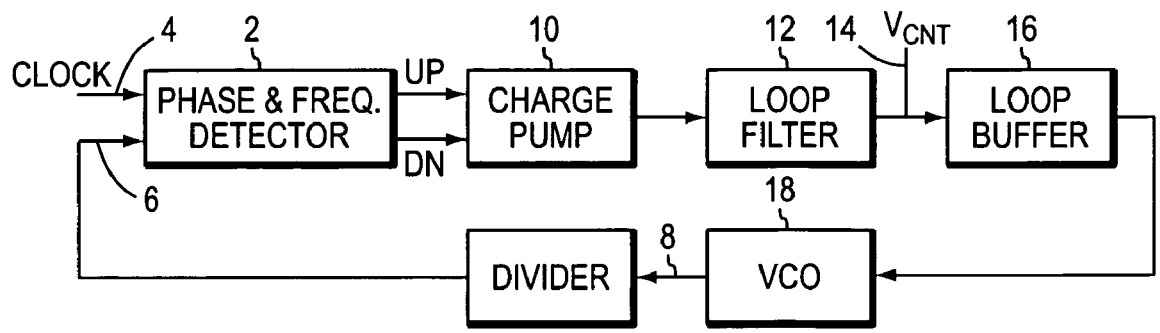
FIG. 1 is a block diagram of a phase locked loop.
Figure 2:
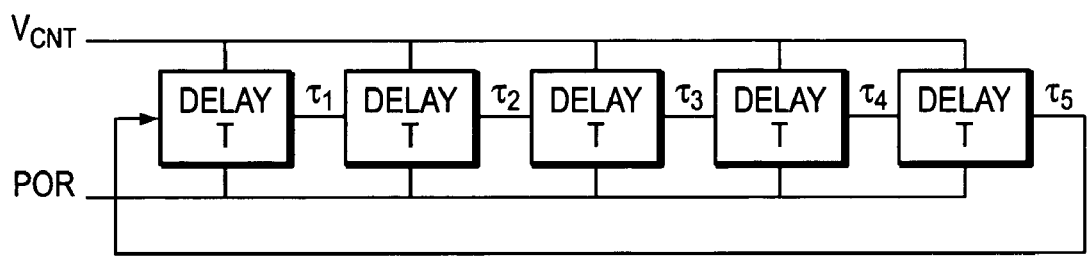
FIG. 2 is a block diagram of a delay looped back oscillator.
Figure 3:
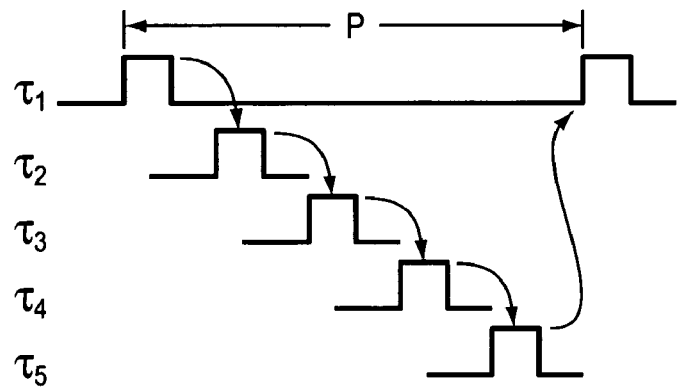
FIG. 3 is. Is a timing diagram of the delay loop of FIG. 2.
Figure 7:
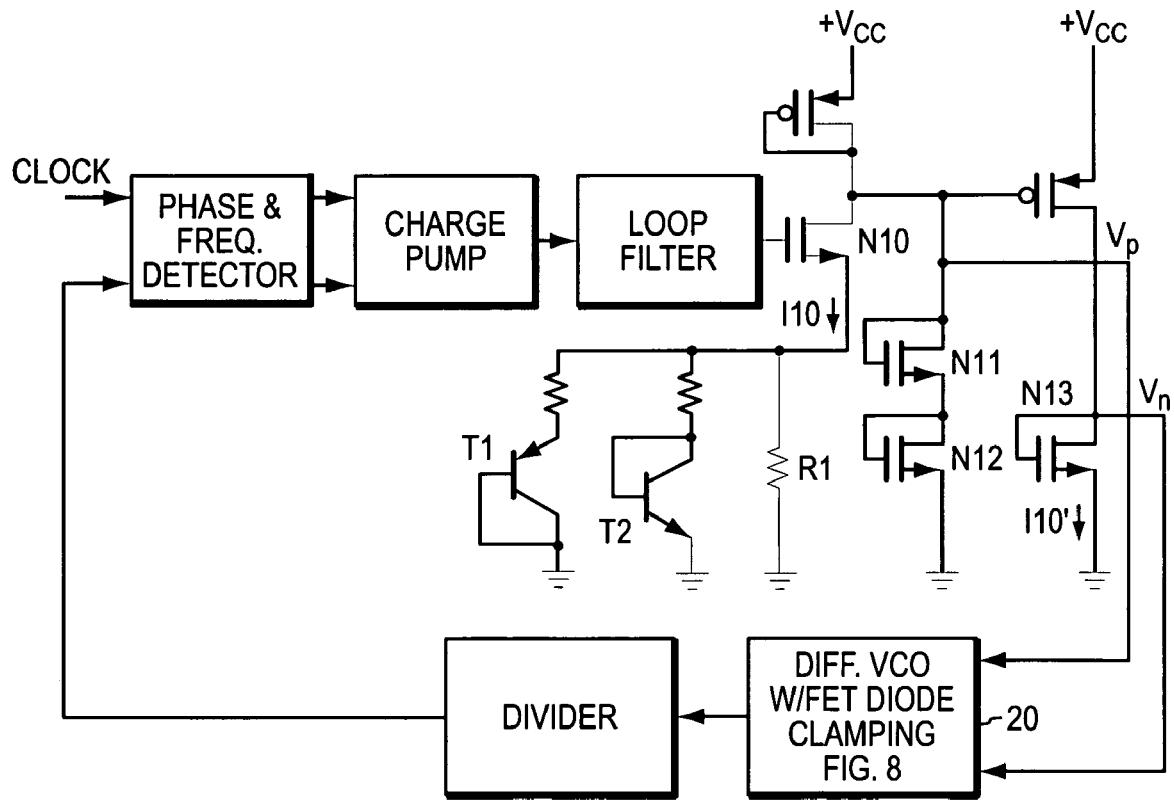
FIG. 7 ios a block/circuit diagram of a phase locked loop including an embodiment of the present invention.

FIG. 7 shows a VCO in a PLL implementing a preferred embodiment of the present invention. The block circuit diagram is a version of FIG. 1 and but implements a loop buffer that distinguishes and improves upon prior art. The VCO 20 is a five stage ring delay oscillator with the control voltages Vp and Vn being fed to each stage in parallel in a manner similar (albeit a single input) to Vcnt of FIG. 2.

Figure 8:
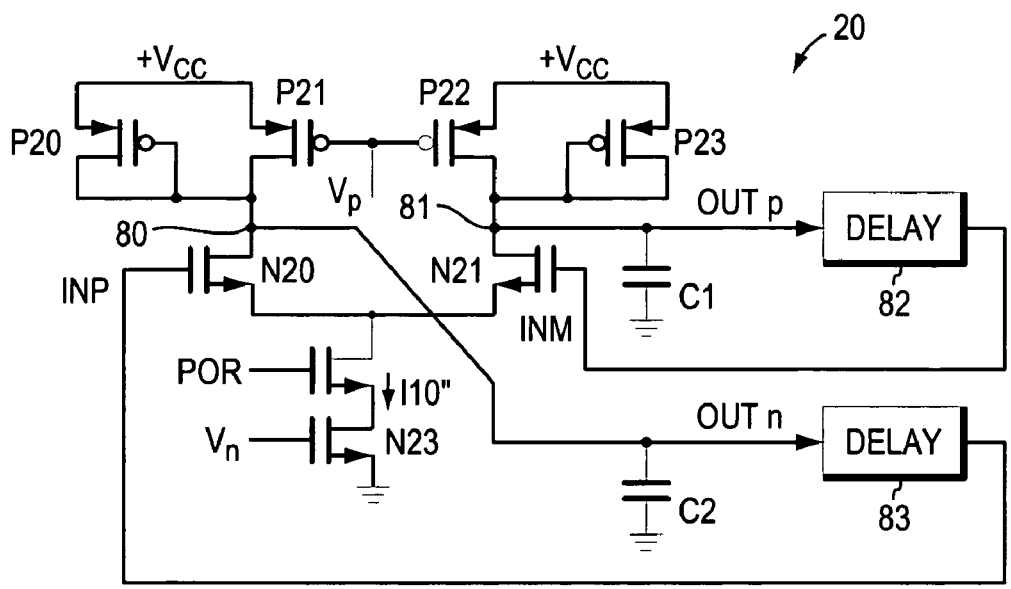
FIG. 8 is a circuit diagram of a differential single delay circuit using charging of a capacitor.

One such delay stage, a differential delay circuit, is shown in FIG. 8. Vp is fed to the gates of P21 and P22 which are current mirrors of the drain current I10 of N10 (FIG. 7). P20 and P23 are FET diode clamps. The FET diode connection N13 of FIG. 7 drain, Vn, connects to the gate of N23 of FIG. 8. Here the current through N13, I10,' is mirrored as I10" in N23. The current I10" will split between N20 and N21 depending on the difference between the voltage INP and INM, respectively. Current from the common drain connections 80 and 81, minus the split currents due to I10", charge the delay capacitors C1 and C2, respectively. Design and operation of the differential delay circuit of FIG. 8, from the schematic of FIG. 8, is within the capability of those practiced in the art. The delayed outputs OUTP and OUTM are fed to succeeding stages (shown as blocks, 82, 83, respectively) and from the last stage the corresponding out signals are connected with the needed inversion to the first stage inputs thereby completing the delay loop. The delayed OUTP is connected to INP input and the delay OUTM to the INM input. As well known, the feed back loop is arranged so that the loop feed back is out of phase with enough gain to create an oscillation. The frequency of oscillation is a function of the delay which is a function of the currents charging the capacitors. Implementing such circuits is well within the skill of ordinary practitioners in the field. Lastly, with respect to FIG. 8, the power on reset, POR, allows the operation of the VCO to start.

Figure 9:
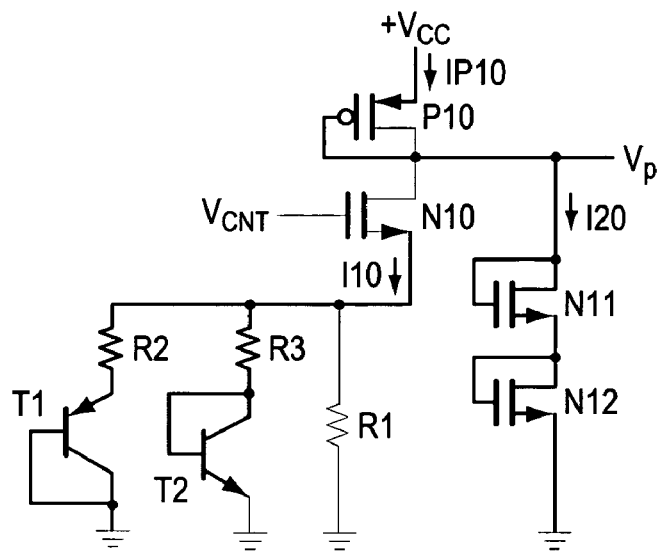
FIG. 9 is a circuit diagram of an embodiment of the present invention.

FIG. 9 isolates the loop buffer of FIG. 7. The source of N10 is fed to a resistor R1 and to R2 and R3 that each lead to bipolar transistors T1 and T2 connected as base-emitter diodes. As is well known, diodes use of emitter resistors produce a diode current-voltage curve that demonstrates a close approximation to the desired square law relationship (similar to the FET diode). An advantage as compared to Moyal, however, is that the base emitter diodes exhibit a negative temperature coefficient as compared to the FET connected diodes. Another advantage is that the bipolar transistors will not track the FET's if the process happens to be producing slow FETs.

Figure 4:
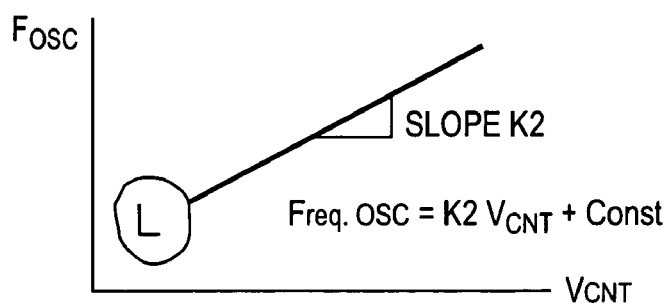
FIG. 4 is a graph of frequency versus a control voltage.
Figure 5:
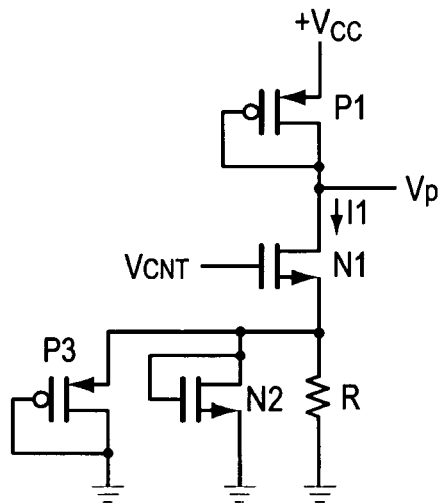
FIG. 5 is a copy of a circuit from a prior art patent (Moyal)
Figure 6:
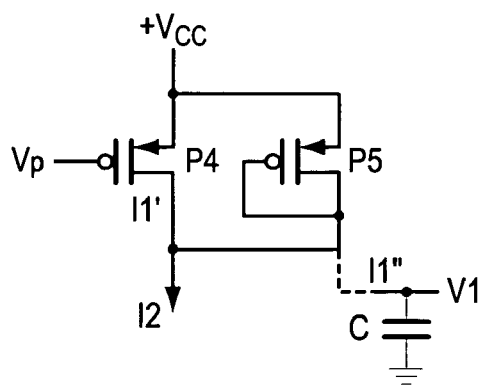
FIG. 6 is a partial circuit diagram showing the charing of a capacitor.

When Vcnt drops towards the voltage threshold of N10 plus the base emitter drops of T1 or T2, the operation of the square law current will diminish as N10 nears a turning off threshold. Referring to the graph of FIG. 4 location L, the linearity of the frequency vs. Vcnt will diminish. At this point, as the voltage at Vp rises, the square law diode connected FET's N11 and N12 will draw current I20 through P10 and maintain the square law relationship with respect to Vp into the L region of FIG. 4. Alternatively as Vcnt rises the currents from N11 and N12 will be reduce as the voltage across N11 and N12 are reduced.

Figure 10:
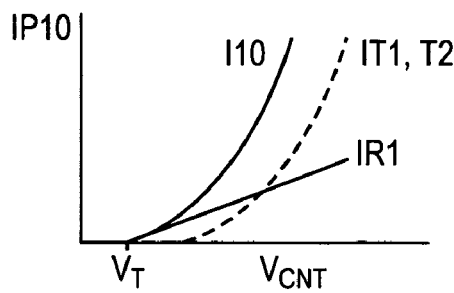
FIGS. 10 and 11 are graphs of current versus control inputs.
Figure 11:
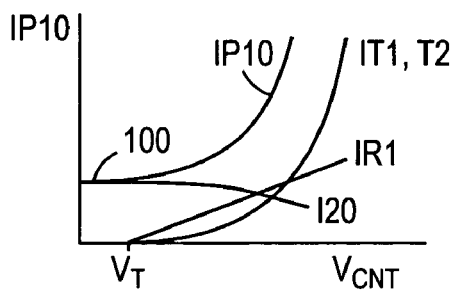

FIG. 10 shows the currents of FIG. 9 without N11 and N12, and FIG. 11, shows the currents with N11 and N12. In FIG. 10 the current through P10 (IP10 on graph) is equal to I10 through N10. Also, note that when Vcnt lowers to VT, there is no current through P10. The current through R1 contributs some linear current when the VT of N10 is reached, but the voltages of the source of N10 must rise above the base-emitter thresholds before current is drawing through T1 and T2. This represents the L area of FIG. 4. But, in FIG. 11, N11 and N12 provide current through P10 allowing for a linear extension of the relationship of FIG. 4 into the L area. From FIG. 11, note the IP10 current flows 100 below when Vcnt reaches Vt. This shows the extension of operation in the L area of FIG. 4.

For large currents used at high frequency operation, the bipolar devices create a greater than square-law current. That is the bipolar current is exponentially related to the applied voltage, although in a preferred embodiment the use of emitter resistors tend to linearize this relationship. This acts to linearize the VCO circuit gain once current to voltage relationship moves from exponential to linear, as shown in FIGS. 10 and 11.

It should be understood that above-described embodiments are being presented herein as examples and that many variations and alternatives thereof are possible. Accordingly, the present invention should be viewed broadly as being defined only as set forth in the hereinafter appended claims.

What is claimed is:

1. A buffer circuit that generates an output signal to control the frequency of a VCO, the buffer circuit comprising:
    a control FET transistor, defining a threshold voltage Vt, a gate, source and drain, where a control signal is connected to the gate,
    a means for receiving at least a portion of the current from the drain of the control FET, wherein the current is responsive to the input control signal, wherein the current controls the frequency of the output signal,
    a bipolar diode connected to receive current from the source of the control FET, wherein the diode compensates for temperature effects of the control FET, and
    a resistor in parallel with the bipolar diode.

2. The VCO of claim 1 wherein the diode comprises an NPN base emitter, and further the buffer circuit having an PNP base emitter arranged as a diode in parallel with the NPN base emitter and with the collectors of the NPN and the PNP connected to their respective bases.

3. The buffer circuit of claim 1 further comprising:
    a second FET, configured with its gate connected to its drain,
    the second FET drain connected to the drain of the first FET wherein the current through the second FET is in series with the current through the first FET.

4. The Vbuffer circuit of claim 3 wherein both the first and second FET's are N type MOSFETS.

5. The buffer circuit of claim 1 wherein the means for receiving the drain current from the first FET comprises a diode connected FET.

6. The buffer circuit of claim 5 further comprising a mirror FET connected as a current mirror to the diode connected FET of claim 5, wherein the current from the mirror FET is also used to control the output signal frequency.

7. A buffer circuit that generates an output signal to control the frequency of a VCO, the buffer circuit comprising:
    a first N type MOSFET with its gate connected to the control input signal,
    a resistor connected to receive the source current from the first N type MOSFET,
    a bipolar NPN diode connected transistor and a bipolar PNP diode connected transistor both connected in parallel with each other and with the resistor and arranged to receive the current from the source of the first N type MOSFET,
    a diode connected P type MOSFET arranged with its drain connected to the drain of the first N type MOSFET transistor and arranged to receive the current from the drain of the first N type MOSFET,
    second and third diode connected N type MOSFET transistors in series with each other and connected to and arranged to draw current from the drain of the P type MOSFET, and
    a second P type MOSFET connected a s a current mirror with the first P type MOSFET transistor, wherein the currents through the first and the second P type MOSFET's control the output signal frequency.

8. The buffer circuit of claim 7 wherein the currents through the first and the second P type MOSFET transistors follow a square law relationship with respect to the input control signal.

* * * * *